United States Patent
Feng et al.

(10) Patent No.: US 10,432,125 B2
(45) Date of Patent: Oct. 1, 2019

(54) METHOD AND CIRCUIT FOR ACQUIRING OUTPUT QUANTITY OF LINEAR RESONANCE ACTUATOR

(71) Applicant: Goertek Inc., Weifang (CN)

(72) Inventors: Yongqiang Feng, Weifang (CN); Lide Wu, Weifang (CN); Bo Li, Weifang (CN)

(73) Assignee: Goertek Inc., Weifang (CN)

( * ) Notice: Subject to any disclaimer, the term of this patent is extended or adjusted under 35 U.S.C. 154(b) by 0 days.

(21) Appl. No.: 15/762,100

(22) PCT Filed: Sep. 5, 2017

(86) PCT No.: PCT/CN2017/100517
§ 371 (c)(1),
(2) Date: Mar. 22, 2018

(87) PCT Pub. No.: WO2018/041265
PCT Pub. Date: Mar. 8, 2018

(65) Prior Publication Data
US 2018/0294757 A1    Oct. 11, 2018

(30) Foreign Application Priority Data

Sep. 5, 2016 (CN) .......................... 2016 1 0803117

(51) Int. Cl.
*H02P 23/00* (2016.01)
*G06F 17/50* (2006.01)
(Continued)

(52) U.S. Cl.
CPC .......... *H02P 23/0022* (2013.01); *G06F 3/016* (2013.01); *G06F 17/50* (2013.01); *H02P 25/032* (2016.02)

(58) Field of Classification Search
CPC . G08B 6/00; H02N 2/008; H02N 2/06; G02B 21/26; G02B 27/646; H02M 7/523;
(Continued)

(56) References Cited

U.S. PATENT DOCUMENTS 7,683,508 B2 * 3/2010 Delson ................. H01F 7/1615
                                                      310/21
8,552,619 B2 * 10/2013 Sumioka ................ H02N 2/142
                                                     310/317

(Continued)

FOREIGN PATENT DOCUMENTS

| CN | 103576858 A | 2/2014 |
| CN | 103620525 A | 3/2014 |

(Continued)

OTHER PUBLICATIONS

International Bureau of WIPO, International Search Report and Written Opinion in Application No. PCT/CN2017/100517 dated Dec. 6, 2017.

*Primary Examiner* — Antony M Paul
(74) *Attorney, Agent, or Firm* — LKGlobal | Lorenz & Kopf, LLP (57) ABSTRACT

A method and circuit for acquiring an output quantity of a linear resonance actuator are disclosed. The method comprises the steps of: establishing a circuit that simulates the linear resonance actuator by using passive electrical devices according to an electrical parameter and a kinematic parameter of the linear resonance actuator, the passive electrical devices comprise at least a resistor, a capacitor and an inductor; selecting a measuring point in the circuit according to an output quantity that the linear resonance actuator needs; and inputting a driving signal of an input source to an input end of the circuit, and collecting an electrical signal that is outputted at the measuring point to obtain the output quantity of the simulated linear resonance actuator. Accord- (Continued)

ing to the technical solution of the application, a circuit module or system model that simulates the linear resonance actuator is established and used in the process of developing and debugging of projects, to replace the technical solutions that directly use physical actuators, thereby improving the efficiency and avoiding the relying on physical actuators.

18 Claims, 4 Drawing Sheets

(51) Int. Cl.
 *H02P 25/032* (2016.01)
 *G06F 3/01* (2006.01)
(58) Field of Classification Search
 CPC .. H02M 2007/4818; H02M 2007/4815; H04N 5/23287; H02P 1/00; H02P 3/00; H02P 6/00; H02P 27/04; H02P 27/06
 USPC ......... 310/316.01, 316.02, 316.03, 317, 318, 310/319, 320, 321; 318/38, 135, 687, 318/560, 400.01, 700, 701, 727, 800, 801; 340/815.62; 363/21.02
 See application file for complete search history.

(56) References Cited

U.S. PATENT DOCUMENTS

| 9,280,144 | B2* | 3/2016 | Paige ....................... G05B 5/01 |
| 9,802,225 | B2* | 10/2017 | Houston ................ G01C 21/20 |
| 9,893,650 | B2* | 2/2018 | Sumioka ............... H02M 7/523 |
| 2012/0229264 | A1* | 9/2012 | Company Bosch .... G06F 3/016 340/407.1 |
| 2012/0232780 | A1* | 9/2012 | Delson ................... A63F 13/06 701/400 |

FOREIGN PATENT DOCUMENTS

| CN | 106326594 A | 12/2014 |
| CN | 206312138 U | 7/2017 |
| KR | 101108248 B1 | 1/2012 |

\* cited by examiner

| Establishing a circuit that simulates the linear resonance actuator by using passive electrical devices according to an electrical parameter and a kinematic parameter of the linear resonance actuator, the passive electrical devices comprise at least a resistor, a capacitor and an inductor | ⟵ S710 |
|---|---|

↓

| Selecting a measuring point in the circuit according to an output quantity that the linear resonance actuator needs | ⟵ S720 |
|---|---|

↓

| Calculating a transfer function from an input end of the circuit to the measuring point | ⟵ S730 |
|---|---|

↓

| Obtaining the output quantity of the simulated linear resonance actuator by calculating according to a driving signal of an input source and the transfer function | ⟵ S740 |
|---|---|

FIG. 7

METHOD AND CIRCUIT FOR ACQUIRING OUTPUT QUANTITY OF LINEAR RESONANCE ACTUATOR

CROSS REFERENCE TO RELATED APPLICATIONS

This application is a U.S. National Stage entry under 35 U.S.C. § 371 based on International Application No.: PCT/CN2017/100517, filed on Sep. 5, 2017, which was published under PCT Article 21(2) and which claims priority to Chinese Patent Application No. 201610803117.2, filed on Sep. 5, 2016, which are all hereby incorporated herein in their entirety by reference.

TECHNICAL FIELD

The application pertains to the technical field of tactile feedback, and particularly pertains to a method and circuit for acquiring an output quantity of a linear resonance actuator.

BACKGROUND

Audio and video techniques relating to the auditory and visual senses have been fully developed and applied in the past decades. In recent years, the industrial community begins to turn to other sensory channels. The developing of force feedback and vibration techniques regarding the tactile sense begins, and the tactile feedback technique is gradually applied in consumer electronics, home appliances and industry. From the vibration prompting in early pagers to touch-control techniques in recent mobile telephones and wearable devices, tactile sense based techniques have become an important part of human-computer interaction techniques.

The component in a tactile feedback system that generates vibration is the actuator (commonly known as motor). The vibration of the actuator is transmitted to the device where it is located, and then conducted to the body and skin of the user, to generate the vibration tactile. Most existing techniques directly use physical actuators in the developing and debugging of driving and controlling algorithms. The methods of the prior art not only have low efficiency, but also have the risk of loss or even damage of the performance of the actuator. In addition, other objects, desirable features and characteristics will become apparent from the subsequent summary and detailed description, and the appended claims, taken in conjunction with the accompanying drawings and this background.

SUMMARY

The application provides a method and circuit for acquiring an output quantity of a linear resonance actuator, to solve the problem in the prior art that when physical actuators are directly used to conduct the developing and debugging of projects, the efficiency is low, and the performance of the actuator is easy to be worn or damaged.

To achieve the above objects, the technical solutions of the application are as follows:

In an aspect, the embodiments of the application provide a method for acquiring an output quantity of a linear resonance actuator, wherein the method comprises the steps of:

establishing a circuit that simulates the linear resonance actuator by using passive electrical devices according to an electrical parameter and a kinematic parameter of the linear resonance actuator, the passive electrical devices comprise at least a resistor, a capacitor and an inductor;

selecting a measuring point in the circuit according to an output quantity that the linear resonance actuator needs; and inputting a driving signal of an input source to an input end of the circuit, and collecting an electrical signal that is outputted at the measuring point to obtain the output quantity of the simulated linear resonance actuator.

In another aspect, the embodiments of the application provide a method for acquiring an output quantity of a linear resonance actuator, wherein the method comprises the steps of:

establishing a circuit that simulates the linear resonance actuator by using passive electrical devices according to an electrical parameter and a kinematic parameter of the linear resonance actuator, the passive electrical devices comprise at least a resistor, a capacitor and an inductor;

selecting a measuring point in the circuit according to an output quantity that the linear resonance actuator needs;

calculating a transfer function from an input end of the circuit to the measuring point; and obtaining the output quantity of the simulated linear resonance actuator by calculating according to a driving signal of an input source and the transfer function.

In another aspect, the embodiments of the application provide a circuit for acquiring an output quantity of a linear resonance actuator, wherein the circuit comprises: a first resistor, a first inductor, a capacitor, a second inductor and a second resistor; and the capacitor, the second inductor and the second resistor are connected in parallel to form a parallel resonance circuit, one end of the first resistor is an anode input end, one end of the first inductor is a cathode input end, and the other end of the first resistor and the other end of the first inductor are respectively connected to two ends of the parallel resonance circuit;

or, the capacitor, the second inductor and the second resistor are connected in series to form a series resonance circuit, one end of the first resistor is an anode input end, one end of the first inductor is a cathode input end, the other end of the first resistor is connected to a first input end of a coupler, the other end of the first inductor is connected to a second input end of the coupler, and the first output end and the second output end of the coupler are respectively connected to two ends of the series resonance circuit;

wherein the resistance values of the first resistor and the second resistor, the inductance values of the first inductor and the second inductor and the capacitance value of the capacitor are determined by an electrical parameter and a kinematic parameter of the linear resonance actuator.

The advantageous effects of the embodiments of the application are as follows. According to the present technical solution, a circuit module or system model that simulates the linear resonance actuator is established by using passive electrical devices, and in the process of developing and debugging of projects, the present technical solution may be used to replace the technical solutions that directly use physical actuators, to improve the work efficiency and avoid the relying on physical actuators. Moreover, according to the present technical solution, an electrical signal that is outputted at the measuring point is collected based on the circuit module to obtain the output quantity of the simulated linear resonance actuator, or a transfer function from an input end of the circuit to the measuring point is calculated based on the circuit module, and the output quantity of the simulated linear resonance actuator is directly calculated from the transfer function, thus a technical solution of computer simulation is provided, and the output quantity of the actuator in the testing process is obtained by the algorithms without using actuators or other electron devices, thereby avoiding the disadvantages of the prior art that actuators are liable to damage or interference by the external environment and the efficiency is low.

According to the present technical solution, module of the linear resonance actuator is reasonably established according to its operating principle, and the working process of the actuator is simulated based on the efficient and simple module, thus the research period of the driving and controlling systems of the actuator can be effectively shortened, and the test effect of tactile vibration can also be simulated. In addition, the modeling and simulation may also be used in the design stage of linear resonance actuators, to simulate and predict its performance before the establishing of the physical model. In the design and development process of tactile feedback systems, the present technical solution is of great practical significance.

BRIEF DESCRIPTION OF DRAWINGS

The present invention will hereinafter be described in conjunction with the following drawing figures, wherein like numerals denote like elements, and.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description.

In order to make the objects, technical solutions and advantages of the application clearer, the embodiments of the application will be described below in further detail in conjunction with the drawings.

The actuator in tactile feedback systems is the key part that executes the controlling instruction and converts a driving signal to physical vibration. Actuators generally include eccentric rotating mass actuators (ERM) and linear resonance actuators (LRA). The application illustrates by using the example of a linear resonance actuator.

The operating principle of linear resonance actuators is that, an alternating electrical signal is applied to an electrically conducting coil of a linear resonance actuator, thereby generating an alternating driving force in the magnetic field to drive a moveable mass block (or called short oscillator) inside the linear resonance actuator to conduct reciprocating motion along a straight line.

Figure 1:
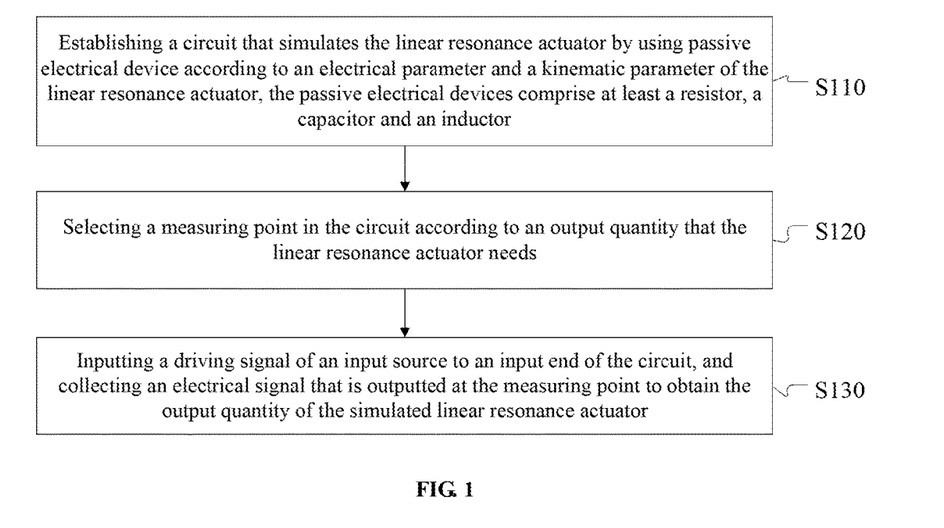
FIG. 1 is a flow chart of a method for acquiring an output quantity of a linear resonance actuator according to an embodiment of the application.

In order to reduce the relying on physical actuators in the early stage of the research and development of tactile feedback systems, improve the research and development efficiency and reduce the research and development cost, a method is to apply computer simulation to the working mechanism of the actuators. On the basis of this, an embodiment of the application provides a method for acquiring an output quantity of a linear resonance actuator. FIG. 1 is a flow chart of a method for acquiring an output quantity of a linear resonance actuator according to an embodiment of the application. As shown in FIG. 1, the method comprises:

S110, establishing a circuit that simulates the linear resonance actuator by using passive electrical devices according to an electrical parameter and a kinematic parameter of the linear resonance actuator, the passive electrical devices comprise at least a resistor, a capacitor and an inductor.

It can be known from the above operating principle of the linear resonance actuator that, the linear resonance actuator is an electromagnetic mechanic system. As the linear resonance actuator comprises an electrically conducting coil, the linear resonance actuator itself has both the resistor attribute and the inductor attribute. Moreover, the resonance part of the linear resonance actuator is a mechanic structure that is formed by a mass block and a spring, so it may be described by using a resistor-inductor-capacitor resonance circuit (namely, RLC resonance circuit).

S120, selecting a measuring point in the circuit according to an output quantity that the linear resonance actuator needs.

The needed output quantity includes the resultant force of the oscillator, the velocity of the oscillator, the acceleration of the oscillator, the displacement of the oscillator, the load current of the linear resonance actuator and the back electromotive force voltage of the linear resonance actuator. The designer may select one or more output quantities according to actual demands, and the measuring point for measuring the data of each of the output quantities may correspond to a line in the circuit or a device in the circuit. For example, the output quantities are acquired by using the current signal flowing through the line, the current signal flowing through the device or the voltage signal that is loaded at the two ends of the device.

S130, inputting a driving signal of an input source to an input end of the circuit, and collecting an electrical signal that is outputted at the measuring point to obtain the output quantity of the simulated linear resonance actuator.

The obtained output quantities may assist the development of the controlling algorithm of the linear resonance actuator, and assist the design and development of tactile effects.

The driving signal may be selected according to the demands. For example, a short pulse signal, a square wave, a sine wave, a pulse width modulation (PWM) signal of one or more periods, etc. may be selected.

In practical applications, the electrical signal that is outputted at the measuring point may be collected by using the following method:

connecting a current sensor or a voltage sensor at each measuring point of the circuit, collecting an electrical signal that is outputted by the current sensor or the voltage sensor, and obtaining the corresponding output quantity of the linear resonance actuator by calculating according to the electrical signals that are outputted at each measuring point.

Accordingly, in the method in FIG. 1, a circuit module is established to simulate the linear resonance actuator, and passive electronic elements, e.g. resistor, capacitor and inductor, are used to form the circuit and simulate the attribute of the linear resonance actuator at the level of circuit, and the working process of the linear resonance actuator can be simulated based on the simple circuit module, thereby effectively shortening the research and development period of the driving and controlling systems of the actuator. In the design stage of the linear resonance actuator, the performance of the linear resonance actuator can also be predicted based on the circuit module.

In another embodiment of the application, Step S110 in FIG. 1 may particularly be: selecting a first resistor and a first inductor according to an electrical parameter of an electrically conducting coil of the linear resonance actuator; and selecting a capacitor, a second resistor and a second inductor according to an electrical parameter of the electrically conducting coil of the linear resonance actuator and a kinematic parameter of an oscillator. The embodiments of the application may establish the circuit that simulates the linear resonance actuator by using one of the following two implementing solutions:

First Implementing Solution

Figure 2:
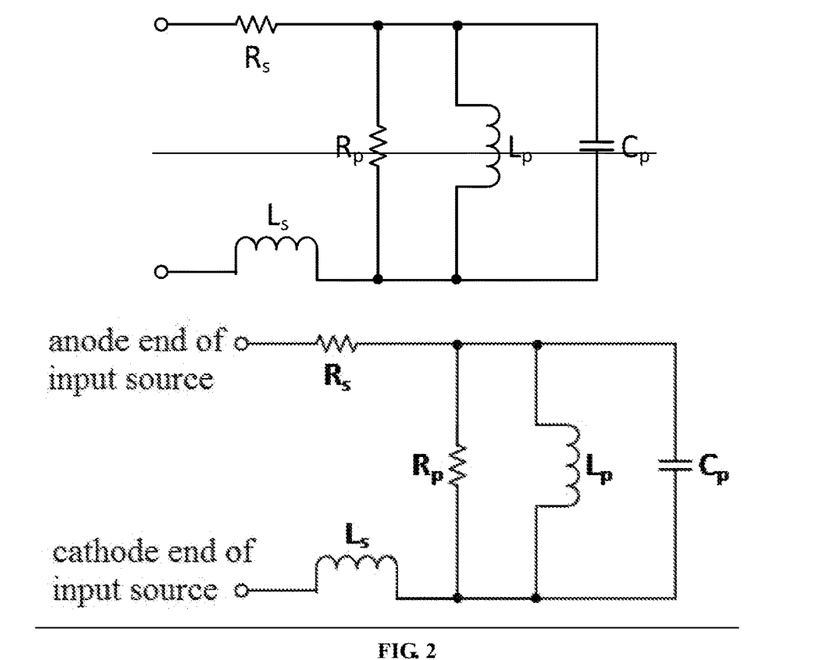
FIG. 2 is a circuit structural diagram of a first circuit that simulates a linear resonance actuator according to another embodiment of the application.

Connecting the first resistor and the first inductor in series and connecting the capacitor, the second inductor and the second resistor in parallel to establish a first circuit that simulates the linear resonance actuator, wherein one end of the first resistor is connected to an anode end of the input source, one end of the first inductor is connected to a cathode end of the input source, the capacitor, the second inductor and the second resistor are connected in parallel to form a parallel resonance circuit, and two ends of the parallel resonance circuit are connected in series respectively between the other end of the first resistor and the other end of the first inductor.

The circuit structure of the first circuit obtained by the present solution may refer to FIG. 2. The resistor Rs and the inductor Ls in FIG. 2 are respectively the first resistor and the first inductor in the present implementing solution, and the electrically conducting coil of the linear resonance actuator is simulated by the resistor Rs and the inductor Ls. The resistor Rp, the inductor Lp and the capacitor Cp in FIG. 2 are respectively the second resistor, the second inductor and the capacitor in the present implementing solution, and the oscillator of the linear resonance actuator is simulated by the parallel resonance circuit that is formed by the resistor Rp, the inductor Lp and the capacitor Cp connected in parallel.

Second Implementing Solution

Figure 3:
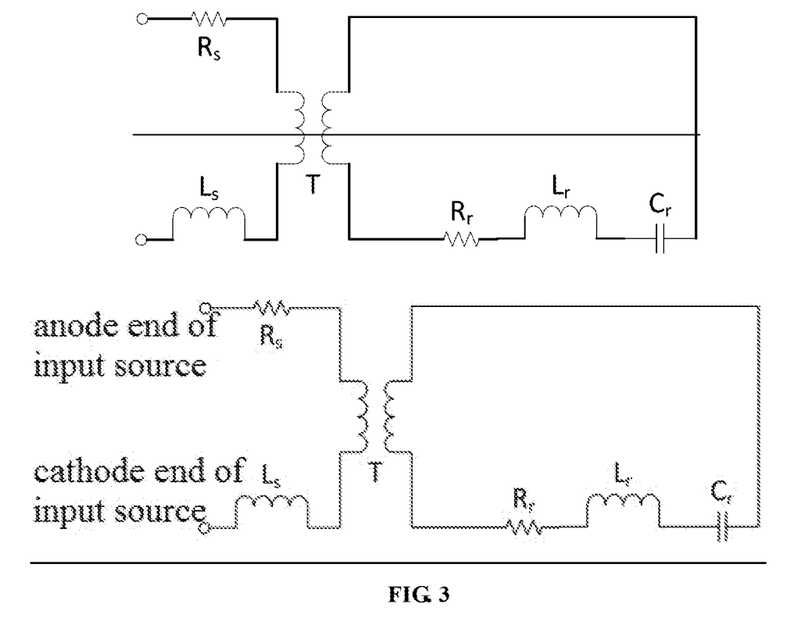
FIG. 3 is a circuit structural diagram of a second circuit that simulates a linear resonance actuator according to another embodiment of the application.

Connecting the first resistor and the first inductor in series, and connecting the capacitor, the second inductor and the second resistor in series to establish a second circuit that simulates the linear resonance actuator, wherein one end of the first resistor is connected to an anode end of the input source, one end of the first inductor is connected to a cathode end of the input source, the other end of the first resistor is connected to a first input end of a coupler, the other end of the first inductor is connected to a second input end of the coupler, the capacitor, the second inductor and the second resistor are connected in series to form a series resonance circuit, and two ends of the series resonance circuit are connected in series respectively between a first output end and a second output end of the coupler.

The circuit structure of the second circuit obtained by the present implementing solution may refer to FIG. 3. The resistor Rs and the inductor Ls in FIG. 3 are respectively the first resistor and the first inductor in the present implementing solution, and the electrically conducting coil of the linear resonance actuator is simulated by the resistor Rs and the inductor Ls. The resistor Rr, the inductor Lr and the capacitor Cr in FIG. 3 are respectively the second resistor, the second inductor and the capacitor in the present implementing solution, and the oscillator of the linear resonance actuator is simulated by the series resonance circuit that is formed by the resistor Rr, the inductor Lr and the capacitor Cr connected in series. The resistor Rs and the inductor Ls connected in series couple and are connected to the resistor Rr, the inductor Lr and the capacitor Cr connected in series via a voltage coupler T.

In the vibration process of the oscillator of the linear resonance actuator, the oscillator is subject to the action of three forces, namely, a Newtonian force that is obtained by calculating according to the product of the acceleration of the oscillator and the mass of the oscillator, a hindering force that is obtained by calculating according to the product of the friction coefficient that the oscillator is subject to in the vibration process and the velocity of the oscillator, and an elastic force that is obtained by calculating according to the product of the elasticity coefficient of the oscillator and the displacement of the oscillator, and the resultant force of the three forces is the resultant force of the oscillator.

When the linear resonance actuator is simulated by using the circuit in FIG. 2, the vibration process of the oscillator may be simulated by using the RLC resonance circuit connected in parallel in the circuit. As the overall current of the RLC resonance circuit is the sum of the current flowing through the resistor Rp, the current flowing through the inductor Lp and the current flowing through the capacitor Cp, in the design process, the correspondence relation between the resultant force of the oscillator and the overall current of the RLC resonance circuit may be established. Regarding the acceleration of the oscillator, the velocity of the oscillator and the displacement of the oscillator that are formed in the vibration process of the oscillator, the velocity of the oscillator is used as the reference value, and the acceleration of the oscillator can be obtained by conducting differential operation to the velocity of the oscillator, and the displacement of the oscillator can be obtained by conducting integral operation to the velocity of the oscillator. However, in the RLC resonance circuit, the value of the current flowing through the resistor Rp can be obtained by conducting division operation to the voltage on the resistor Rp, the value of the current flowing through the inductor Lp can be obtained by conducting integral operation to the voltage that is applied on the inductor Lp, and the value of the current of the capacitor Cp flowing through can be obtained by conducting differential operation to the voltage that is applied on the capacitor Cp. By analysis, the correspondence relation between the acceleration of the oscillator that involves differential operation and the current flowing through the capacitor Cp in the RLC resonance circuit can be established, the correspondence relation between the displacement of the oscillator that involves integral operation and the current flowing through the inductor Lp in the RLC resonance circuit can be established, and the correspondence relation between the velocity of the oscillator that does not involve integral operation or differential operation and the current flowing through the resistor Rp in the RLC resonance circuit can be established.

After the above correspondence relations are determined, the parameters of the passive electrical devices are determined by using the following method:

setting the resistance value and the inductance value of the electrically conducting coil of the linear resonance actuator respectively as the first resistance value (namely, the resistor Rs) and the first inductance value (namely, the inductor Ls); and obtaining a second resistance value, a capacitance value and a second inductance value by calculating according to the resistance value and the inductance value of the electrically conducting coil of the linear resonance actuator, an operating current and an operating voltage of the linear resonance actuator, and a resonance frequency and a frequency bandwidth of the oscillator of the linear resonance actuator.

For example, in the first circuit shown in FIG. 2, the second resistance value (namely, the resistor Rp) can be obtained by calculating according to the resistance value and the inductance value of the electrically conducting coil of the linear resonance actuator, the operating current I and the operating voltage V of the linear resonance actuator, and the resonance frequency of the oscillator of the linear resonance actuator; the capacitance value (namely, the capacitor Cp) can be obtained by calculating according to the second resistance value and the frequency bandwidth $B_0$ of the oscillator of the linear resonance actuator; the second inductance value (namely, the inductor Lp) can be obtained by calculating according to the capacitance value and the resonant frequency $\omega_0$ of the oscillator of the linear resonance actuator. In the second circuit shown in FIG. 3, the second resistance value (namely, the resistor Rr) can be obtained by calculating according to the resistance value and the inductance value of the electrically conducting coil of the linear resonance actuator, the operating current I and the operating voltage V of the linear resonance actuator, and the resonance frequency of the oscillator of the linear resonance actuator; the second inductance value (namely, the inductor Lr) can be obtained by calculating according to the second resistance value and the frequency bandwidth $B_0$ of the oscillator of the linear resonance actuator; the capacitance value (namely, the capacitor Cr) can be obtained by calculating according to the second inductance value and the resonant frequency $\omega_0$ of the oscillator of the linear resonance actuator.

It should be noted that, linear resonance actuator suppliers generally do not provide parameters such as the electromagnetic parameter Km of the actuator, the mass of the oscillator of the actuator, the elasticity coefficient of the oscillator and the friction coefficient of the oscillator, but generally provide working parameters such as the resistance value and the inductance value of the electrically conducting coil of the linear resonance actuator, the operating current and the operating voltage of the linear resonance actuator, and the resonance frequency and the frequency bandwidth of the oscillator of the linear resonance actuator, so in the application, preferably, the above working parameters are used to calculate the parameter values of the passive electrical devices in the first circuit or the second circuit. If parameters such as the electromagnetic parameter Km of the actuator, the mass of the oscillator of the actuator, the elasticity coefficient of the oscillator and the friction coefficient of the oscillator are provided by linear resonance actuator suppliers, the second resistance value, the capacitance value and the second inductance value may also be obtained by calculating based on the correspondence relation between the mechanical equation of the oscillator and the electrical equation in the first circuit or the second circuit, the electromagnetic parameter Km of the linear resonance actuator, the mass of the oscillator of the linear resonance actuator, the elasticity coefficient of the oscillator and the friction coefficient of the oscillator are used in the calculating.

It can be seen by comparing FIG. 2 and FIG. 3, the first resistance value (the resistor Rs) and the first inductance value (the inductor Ls) that are used to simulate the electrically conducting coil of the linear resonance actuator in FIG. 2 are the same as the first resistance value (the resistor Rs) and the first inductance value (the inductor Ls) that are used to simulate the electrically conducting coil of the linear resonance actuator in FIG. 3 respectively, but the second resistance value (the resistor Rp), the second inductance value (the inductor Lp) and the capacitance value (the capacitor Cp) that are used to simulate the resonance movement of the oscillator of the linear resonance actuator in FIG. 2 are different from the second resistance value (the resistor Rr), the second inductance value (the inductor Lr) and the capacitance value (the capacitor Cr) that are used to simulate the resonance movement of the oscillator of the linear resonance actuator in FIG. 3 respectively.

After the circuit that simulates the linear resonance actuator is established according to the above method, the method for selecting the measuring point of Step S120 in FIG. 1 is illustrated in detail by another embodiment of the application. The method for selecting the measuring point is as follows:

when the circuit that simulates the linear resonance actuator is the first circuit, selecting one end of the first resistor or one end of the first inductor as a measuring point of a resultant force of the oscillator of the linear resonance actuator; selecting the end of the second resistor that is connected to the first inductor as a measuring point of a velocity of the oscillator of the linear resonance actuator; selecting the end of the second inductor that is connected to the first inductor as a measuring point of a displacement of the oscillator of the linear resonance actuator; selecting the end of the capacitor that is connected to the first inductor as a measuring point of an acceleration of the oscillator of the linear resonance actuator; and selecting the capacitor as a measuring point of a back electromotive force voltage of the linear resonance actuator. In the measuring, a voltage sensor is connected to the two ends of the capacitor Cp, and the output voltage of the voltage sensor can simulate the resultant force of the oscillator of the linear resonance actuator. One or more of the measuring points may be selected according to the needs.

When the circuit that simulates the linear resonance actuator is the second circuit, selecting one end of the second resistor or one end of the second inductor or one end of the capacitor as a measuring point of a resultant force of the oscillator of the linear resonance actuator; selecting the second resistor as a measuring point of a velocity of the oscillator of the linear resonance actuator; selecting the second inductor as a measuring point of an acceleration of the oscillator of the linear resonance actuator; selecting the capacitor as a measuring point of a displacement of the oscillator of the linear resonance actuator; and selecting the input end of the coupler as a measuring point of a back electromotive force voltage of the linear resonance actuator. In the measuring, a voltage sensor is connected to the two input ends of the coupler, and the output voltage of the voltage sensor can simulate the resultant force of the oscillator of the linear resonance actuator. One or more of the measuring points may be selected according to the needs.

After the measuring points have been selected according to the above method, the method for acquiring the output quantity of the linear resonance actuator of Step S130 in FIG. 1 is illustrated by another embodiment of the application in detail. The acquiring method is as follows:

connecting a current sensor or a voltage sensor at each measuring point of the circuit that simulates the linear resonance actuator, collecting an electrical signal that is outputted by the current sensor or the voltage sensor, and obtaining the corresponding output quantity of the linear resonance actuator by calculating according to the electrical signals that are outputted by each measuring point.

In an implementing solution of the present embodiment, the output quantity of the linear resonance actuator is obtained by the following calculation method:

calculating the electromagnetic parameter Km (also referred to as the motor parameter of the linear resonance actuator) according to the length and the magnetic flux density of the electrically conducting coil of the linear resonance actuator; calculating each conversion coefficient that is corresponding to the electrical signal that is outputted by each measuring point according to the electromagnetic parameter Km and a parameter of the passive electrical device in the circuit; and obtaining the output quantity corresponding to the linear resonance actuator by calculating a product of the electrical signal that is outputted by each measuring point and the conversion coefficient corresponding to the electrical signal.

The method for calculating the conversion coefficients of the electrical signals that are outputted at each measuring point is as follows:

when the circuit that simulates the linear resonance actuator is the first circuit, obtaining the conversion coefficient $G_{LRA}$ of the electrical signal that is outputted at the measuring point corresponding to the resultant force of the oscillator of the linear resonance actuator by calculating according to the electromagnetic parameter Km; obtaining the conversion coefficient $G_R$ of the electrical signal that is outputted at the measuring point corresponding to the velocity of the oscillator of the linear resonance actuator by calculating according to the electromagnetic parameter Km and the second resistance value (namely, the resistor Rp), obtaining the conversion coefficient $G_L$ of the electrical signal that is outputted at the measuring point corresponding to the displacement of the oscillator of the linear resonance actuator by calculating according to the electromagnetic parameter Km and the second inductance value (namely, the inductor Lp); obtaining the conversion coefficient $G_C$ of the electrical signal that is outputted at the measuring point corresponding to the acceleration of the oscillator of the linear resonance actuator by calculating according to the electromagnetic parameter Km and the capacitance value (namely, the capacitor Cp).

Figure 4:
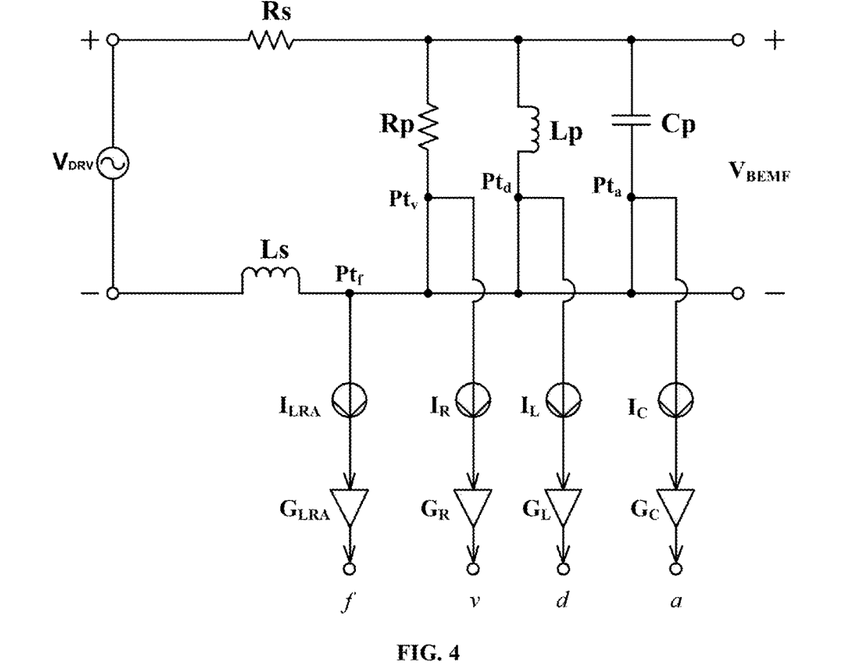
FIG. 4 is a circuit structural diagram of a first circuit for acquiring an output quantity of a linear resonance actuator according to another embodiment of the application.

Referring to FIG. 4, in the measuring, a current sensor and a converter may be connected sequentially to one end $Pt_f$ of the inductor Ls that is connected to the resistor Rp, alternatively, a current sensor and a converter may also be connected sequentially to one end of the inductor Ls that is connected to the cathode end of the input source, or one end of the resistor Rs that is connected to the resistor Rp, or one end of the resistor Rs that is connected to the anode end of the input source; the current signal $I_{LRA}$ flowing through the inductor Ls, which is the load current of the linear resonance actuator, is collected by using the current sensor and converted into an output quantity that simulates the resultant force of the oscillator of the linear resonance actuator by using the converter having a conversion coefficient $G_{LRA}$. A current sensor and a converter are connected sequentially to one end $Pt_v$ of the resistor Rp that is connected to the inductor Ls, the current signal $I_R$ flowing through the resistor Rp is collected by using the current sensor, and converted into an output quantity that simulates the velocity of the oscillator of the linear resonance actuator by using the converter having a conversion coefficient $G_R$; a current sensor and a converter are connected sequentially to one end $Pt_d$ of the inductor Lp that is connected to the inductor Ls, the current signal $I_L$ flowing through the inductor Lp is collected by using the current sensor, and converted into an output quantity that simulates the displacement of the oscillator of the linear resonance actuator by using the converter having a conversion coefficient $G_L$; and a current sensor and a converter are connected sequentially to one end $Pt_a$ of the capacitor Cp that is connected to the inductor Ls, the current signal IC flowing through the capacitor Cp is collected by using the current sensor, and converted into an output quantity that simulates the acceleration of the oscillator of the linear resonance actuator by using the converter having a conversion coefficient $G_C$.

When the circuit that simulates the linear resonance actuator is the second circuit, obtaining the conversion coefficient $M_{LRA}$ of the electrical signal that is outputted at the measuring point corresponding to the resultant force of the oscillator of the linear resonance actuator by calculating according to the electromagnetic parameter Km; obtaining the conversion coefficient $M_R$ of the electrical signal that is outputted at the measuring point corresponding to the velocity of the oscillator of the linear resonance actuator by calculating according to the electromagnetic parameter Km and the second resistance value (namely, the resistor Rr); obtaining the conversion coefficient $M_L$ of the electrical signal that is outputted at the measuring point corresponding to the acceleration of the oscillator of the linear resonance actuator by calculating according to the electromagnetic parameter Km and the second inductance value (namely, the inductor Lr); obtaining the conversion coefficient $M_C$ of the electrical signal that is outputted at the measuring point corresponding to the displacement of the oscillator of the linear resonance actuator by calculating according to the electromagnetic parameter Km and the capacitance value (namely, the capacitor Cr).

Figure 5:
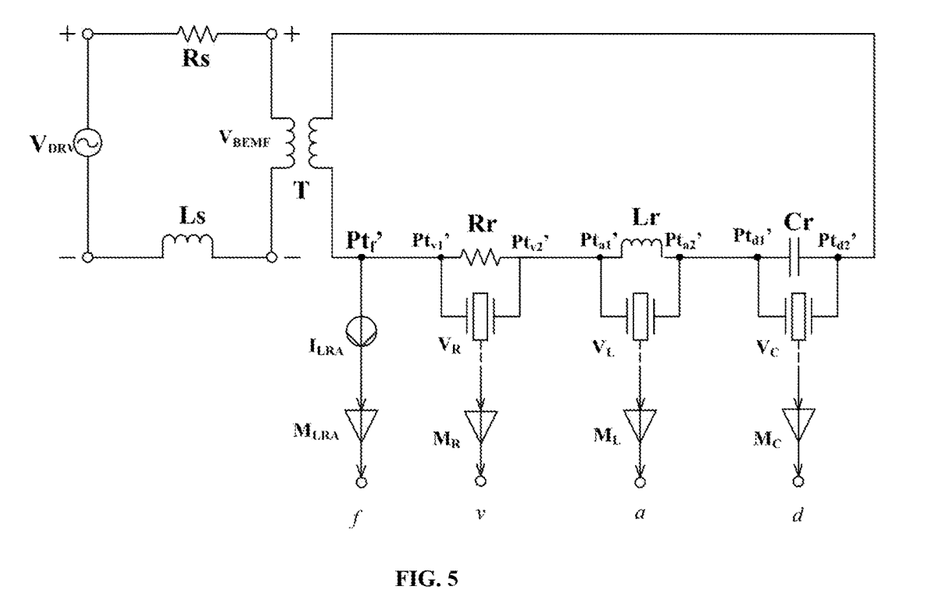
FIG. 5 is a circuit structural diagram of a second circuit for acquiring an output quantity of a linear resonance actuator according to another embodiment of the application.

Referring to FIG. 5, in the measuring, a current sensor and a converter may be connected sequentially to one end Ptf' of the inductor Ls that is connected to the resistor Rr; as the resistor Rr, the inductor Lr and the capacitor Cr are connected in series and thus the currents flowing through the resistor Rr, the inductor Lr and the capacitor Cr are the same, a current sensor and a converter may also be connected sequentially to one end of the resistor Rr that is connected to the inductor Lr, or one end of the inductor Lr that is connected to the resistor Rr, or one end of the inductor Lr that is connected to the capacitor Cr, or one end of the capacitor Cr that is connected to the coupler; the current signal $I_{LRA}$ flowing through the inductor Ls, which is the load current of the linear resonance actuator, is collected by using the current sensor and converted into an output quantity that simulates the resultant force of the oscillator of the linear resonance actuator by using the converter having a conversion coefficient $M_{LRA}$; a voltage sensor is connected in parallel to the two ends ($Pt_{v1}'$, $Pt_{v2}'$) of the resistor Rr and is connected to the converter, the voltage signal VR is collected at the two ends of the resistor Rr by using the voltage sensor and converted into an output quantity that simulates the velocity of the oscillator of the linear resonance actuator by using the converter having a conversion coefficient $M_R$; a voltage sensor is connected in parallel to the two ends ($Pt_{a1}'$, $Pt_{a2}'$) of the inductor Lr and is connected to the converter, the voltage signal VL is collected at the two ends of the inductor Lr by using the voltage sensor and converted into an output quantity that simulates the acceleration of the oscillator of the linear resonance actuator by using the converter having a conversion coefficient $M_L$; a voltage sensor is connected in parallel to the two ends ($Pt_{d1}'$, $Pt_{d2}'$) of the capacitor Cr and is connected to the converter, the voltage signal VC is collected at the two ends of the capacitor Cr by using the voltage sensor and converted into an output quantity that simulates the displacement of the oscillator of the linear resonance actuator by using the converter having a conversion coefficient $M_C$.

The converters are expressed as amplifiers in FIGS. 4 and 5, and the conversion coefficients of the converters are correspondingly the amplification coefficients of the amplifiers.

It should be noted that, the testing method of the application may be realized by a processor executing a program instruction which is stored in a machine readable storage medium and realizes the method steps of the above embodiment of the application when executed by the processor. In different embodiments, the machine readable storage medium may be an internal storage or a nonvolatile memory. The nonvolatile memory may be a storage driver (such as a hard disk drive), a solid-state drive, any kind of memory discs (such as optical disc and DVD), or similar storage media, or their combinations. The internal storage may be an RAM (Radom Access Memory), a volatile memory, a non-volatile memory, or a flash memory. It can be understood that, the method and steps of the above embodiment of the application may be executed on simulation platforms such as Simulink and SPICE. The illustration is made below by using the example of acquiring the output quantity of the linear resonance actuator on the Simulink simulation platform.

It is assumed that, regarding an actuator that has the resonance frequency of 175 Hz, the simulation results to be acquired are the load current $I_{LRA}$, the back electromotive force voltage $V_{BEMF}$ and the output quantity that simulates the acceleration of the oscillator of the linear resonance actuator.

First, the circuit structure in FIG. 2 is constructed on the Simulink simulation platform, and then a measuring point is selected in the circuit according to the output quantity that the linear resonance actuator needs. On the basis of the above assumption, a current sensor may be connected to one end of the inductor Ls that is connected to the resistor Rp, a voltage sensor is connected in parallel to the two ends of the capacitor Cp, and a current sensor and a converter are connected sequentially to one end of the capacitor Cp that is connected to the inductor Ls; and then the corresponding driving signal is selected according to the demands, and the output quantity of the current sensor or the voltage sensor or the converter of each measuring point is collected and displayed.

Figure 6A:
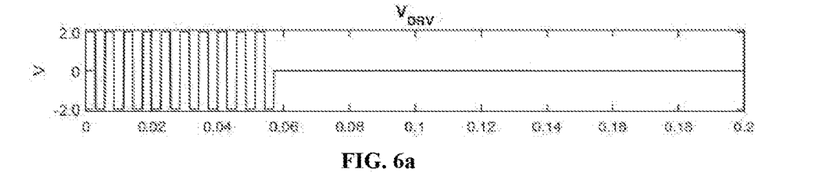
FIG. 6a is a schematic diagram of a driving signal according to another embodiment of the application.
Figure 6B:
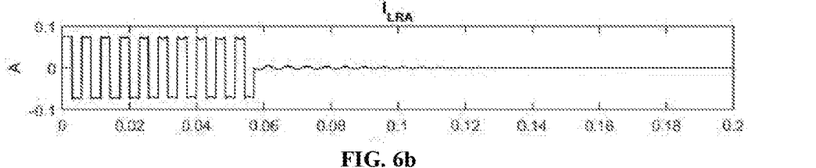
FIG. 6b is a schematic diagram of the outputting of the load current of a linear resonance actuator at the corresponding measuring point under the exciting of the driving signal of FIG. 6a according to another embodiment of the application.
Figure 6C:
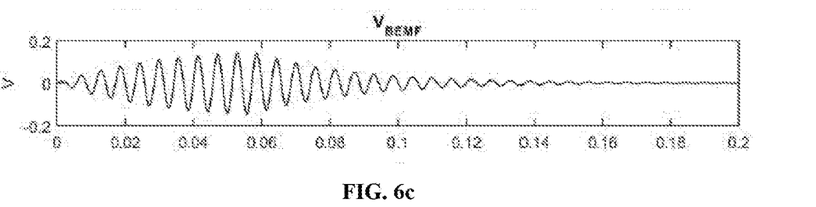
FIG. 6c is a schematic diagram of the outputting of the back electromotive force voltage of a linear resonance actuator at the corresponding measuring point under the exciting of the driving signal of FIG. 6a according to another embodiment of the application.
Figure 6D:
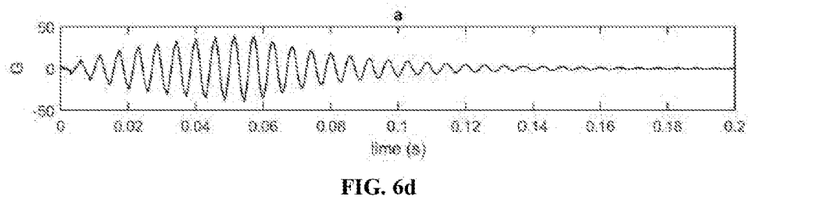
FIG. 6d is a schematic diagram of the outputting of the acceleration of an oscillator of a linear resonance actuator at the corresponding measuring point under the exciting of the driving signal of FIG. 6a according to another embodiment of the application.

As an example, a square signal may be selected as the driving signal. As shown in FIG. 6a, a driving voltage signal that has an alternative frequency of 175 Hz, a low level and a high level of respectively −2 V and 2 V, and lasts 10 periods on the timeline of 0-0.2 second is shown. FIG. 6b-FIG. 6d sequentially show the curves of the signals of the load current $I_{LRA}$ and the back electromotive force voltage $V_{BEMF}$ that are outputted at the corresponding measuring points of the circuit and the output quantity that simulates the acceleration of the oscillator of the linear resonance actuator under the driving of the square signal $V_{DRV}$, the load current $I_{LRA}$ is approximately between −0.08 A and 0.08 A, and also appears as a square signal, and both the back electromotive force voltage $V_{BEMF}$ and the output quantity that simulates the acceleration a of the oscillator of the linear resonance actuator appear as fluctuating sine signals.

Accordingly, the output quantity of the linear resonance actuator is obtained at the level of circuit by the above embodiment of the application.

On the basis of the circuit module, the linear resonance actuator may also be simulated by using a single-input multiple-output system or single-input single-output system, thus the output quantity of the linear resonance actuator may be obtained based on the system model.

Figure 7:
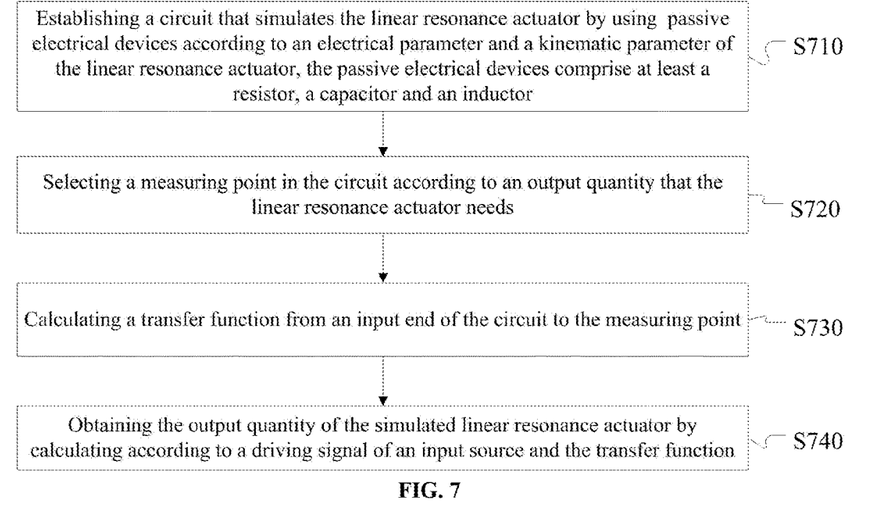
FIG. 7 is a flow chart of a method for acquiring an output quantity of a linear resonance actuator according to another embodiment of the application.

As shown in FIG. 7, FIG. 7 is the flow chart of a method for acquiring an output quantity of a linear resonance actuator according to another embodiment of the application. The method comprises:

S710, establishing a circuit that simulates the linear resonance actuator by using passive electrical devices according to an electrical parameter and a kinematic parameter of the linear resonance actuator, the passive electrical devices comprise at least a resistor, a capacitor and an inductor;

S720, selecting a measuring point in the circuit according to an output quantity that the linear resonance actuator needs;

S730, calculating a transfer function from an input end of the circuit to the measuring point; and S740, obtaining the output quantity of the simulated linear resonance actuator by calculating according to a driving signal of an input source and the transfer function.

The particular contents of Steps S710 and S720 in FIG. 7 may refer to Steps S110 and S120 in FIG. 1 and are not repeated here.

In another embodiment of the application, regarding Step S730 in FIG. 7, the transfer function from the input end of the circuit to the measuring point may be calculated according to the following method. The method comprises:

determining conversion relation between the output quantity of the linear resonance actuator and an electrical signal that is outputted at the measuring point of the circuit; the linear relation between the output quantity of the linear resonance actuator and the electrical signal that is outputted at the measuring point of the circuit can be obtained by referring to the method for calculating the conversion coefficients of the corresponding converters that are connected to the measuring points in FIG. 4, and calculating the transfer function that uses the output quantity of the linear resonance actuator as an output variable and uses the driving signal of the input end as an input variable according to the correspondence relation, a circuit structure of the circuit and a parameter of the passive electrical device.

To facilitate understanding, the illustration is made by taking the example of acquiring the output quantity that simulates the resultant force of the oscillator of the linear resonance actuator based on the circuit structure in FIG. 4.

The measuring point corresponding to the output quantity that simulates the resultant force of the oscillator of the linear resonance actuator is one end of the inductor Ls in the circuit that is connected to the resistor Rp. According to the circuit structure and basic circuit laws such as Kirchhoff's current law KCL or Kirchhoff's voltage law KVL, it can be obtained that, when the output current $I_{LRA}$ of the measuring point is the output variable y(t) and the driving signal $V_{DRV}$ is the input variable x(t), the relation may be expressed by function as y(t)=F{x(t)}. The calculating method may use the methods in the prior art, for example, conducting Laplace transform on a consecutive time domain to the input variable x(t) and the output variable y(t), and calculating to obtain the system transfer function on the consecutive time domain H(s)=Y(s)/X(s) by using the input variable X(s) and the output variable Y(s) that have been transformed; alternatively, conducting Z transform on a discrete time domain to the input variable x(t) and the output variable y(t), and calculating to obtain the system transfer function on the discrete time domain H(z)=Y(z)/X(z) by using the input variable X(z) and the output variable Y(z) that have been Z transformed.

In another embodiment of the application, the transfer function from the input end of the circuit to the measuring point may be established by one of the following two modes:

The first mode is that, the circuit that simulates the linear resonance actuator is established by using two inductors, one capacitor and two resistors, the circuit structure may refer to FIG. 2 or FIG. 3, and a three-order transfer function from the input end of the circuit to the measuring point is obtained by calculating according to inductance values of the two inductors, resistance values of the two resistors and a capacitance value.

The illustration is made by taking the example of acquiring the output quantity that simulates the acceleration of the oscillator of the linear resonance actuator. As shown in FIG. 4, the measuring point corresponding to the output quantity is one end of the capacitor Cp that is connected to the inductor Ls. It can be obtained according to the circuit structure and basic circuit laws that, if the output quantity of the converter corresponding to the measuring point is used as the output variable Y(s) and the square signal is used as the input variable X(s), $$H(s) = \frac{s^2}{L_s s^3 + c_2 s^2 + c_1 s + c_0}$$

is obtained by calculating according to H(s)=Y(s)/X(s), wherein the coefficients $c_0$, $c_1$ and $c_2$ are determined by the parameters of the passive electrical devices in the circuit structure (namely, the inductance values of the two inductors, the resistance values of the two resistors and the capacitance value).

The second mode is that, the circuit that simulates the linear resonance actuator is established by using one inductor, one capacitor and two resistors, and the circuit structure may refer to the circuit structure in FIG. 2 or FIG. 3 in which the inductor Ls is replaced by a lead. A two-order transfer function from the input end of the circuit to the measuring point may be obtained first by calculating according to the inductance value, the capacitance value and the resistance values of the two resistors, and then coefficient substitution is conducted to the two-order transfer function, to enable the two-order transfer function to be an expression about the resonance frequency, damping ratio and gain of the circuit.

Regarding the above two modes, the transfer function of the first mode has relatively high accuracy but also has relatively high complexity, so it is not convenient to analyze the dynamic performance of the resonator system (namely, the simulated linear resonance actuator) corresponding to the transfer function. The two-order transfer function of the second mode is established by ignoring the inductor Ls and is accordingly a two-order underdamping resonance system; as the transfer function of the two-order underdamping resonance system may be expressed by using the resonance frequency, damping ratio and gain of the circuit, and the dynamic performance of the system is determined by the resonance frequency and the damping ratio, it is convenient to analyze the actuator performance if the linear resonance actuator is simulated by using the simplified two-order transfer function.

On the basis of the same design concept as that of the method for acquiring an output quantity of a linear resonance actuator, the embodiments of the application further provide a circuit for acquiring an output quantity of a linear resonance actuator.

The circuit comprises: a first resistor, a first inductor, a capacitor, a second inductor and a second resistor; and the resistance values of the first resistor and the second resistor, the inductance values of the first inductor and the second inductor and the capacitance value are determined by an electrical parameter and a kinematic parameter of the linear resonance actuator.

In the present embodiment, the above passive electrical devices are connected in at least one of the following two connection modes.

The first mode is that, the capacitor, the second inductor and the second resistor are connected in parallel to form a parallel resonance circuit; one end of the first resistor is an anode input end, one end of the first inductor is a cathode input end, and the other end of the first resistor and the other end of the first inductor are connected to two ends of the parallel resonance circuit respectively.

The circuit structure that is connected by the above mode may refer to FIG. 2. The resistor Rs and the inductor Ls in FIG. 2 are respectively the first resistor and the first inductor in the present implementing solution, and the resistor Rp, the inductor Lp and the capacitor Cp in FIG. 2 are respectively the second resistor, the second inductor and the capacitor in the present implementing solution.

The resistance value and the inductance value of the electrically conducting coil of the linear resonance actuator are respectively the resistance value of the first resistor and the inductance value of the first inductor, and the resistance value of the second resistor, the capacitance value of the capacitor and the inductance value of the second inductor are obtained by calculating of the resistance value and the inductance value of the electrically conducting coil of the linear resonance actuator, the operating current I and the operating voltage V of the linear resonance actuator, and the resonance frequency $\omega_0$ and the frequency bandwidth $B_0$ of the oscillator of the linear resonance actuator.

In a preferable technical solution of the present embodiment, the circuit in FIG. 2 further comprises: a first current sensor that is connected to one end of the first resistor or one end of the first inductor, an output quantity of the first current sensor is a load current of the linear resonance actuator; and/or, a second current sensor that is connected to one end of the second resistor that is connected to the first inductor; and/or, a third current sensor that is connected to one end of the second inductor that is connected to the first inductor; and/or, a fourth current sensor that is connected to one end of the capacitor that is connected to the first inductor; and/or, a voltage sensor that is connected in parallel to the capacitor, an output quantity of the voltage sensor is a back electromotive force voltage of the linear resonance actuator.

As shown in FIG. 4, compared with FIG. 2, the circuit in FIG. 4 further comprises: a first converter that is connected to the first current sensor, an output quantity of the first converter is a resultant force of an oscillator of the linear resonance actuator; and/or, a second converter that is connected to the second current sensor, an output quantity of the second converter is a velocity of the oscillator of the linear resonance actuator; and/or, a third converter that is connected to the third current sensor, an output quantity of the third converter is a displacement of the oscillator of the linear resonance actuator; and/or, a fourth converter that is connected to the fourth current sensor, an output quantity of the fourth converter is an acceleration of the oscillator of the linear resonance actuator.

The conversion coefficient of the first converter $G_{LRA}$ is the electromagnetic parameter Km of the linear resonance actuator, and the conversion coefficient of the second converter $G_R$ is obtained by calculating of the electromagnetic parameter Km of the linear resonance actuator and the resistance value of the second resistor; the conversion coefficient of the third converter $G_L$ is obtained by calculating of the electromagnetic parameter Km of the linear resonance actuator and the inductance value of the second inductor; the conversion coefficient of the fourth converter $G_C$ is obtained by calculating of the electromagnetic parameter Km of the linear resonance actuator and the capacitance value of the capacitor.

The second mode is that, the capacitor, the second inductor and the second resistor are connected in series to form a series resonance circuit; one end of the first resistor is an anode input end, one end of the first inductor is a cathode input end, the other end of the first resistor is connected to a first input end of a coupler, the other end of the first inductor is connected to a second input end of the coupler, and the first output end and the second output end of the coupler are connected to two ends of the series resonance circuit respectively.

The circuit structure that is connected by the above mode may refer to FIG. 3. The resistor Rs and the inductor Ls in FIG. 3 are respectively the first resistor and the first inductor in the present implementing solution, and the resistor Rr, the inductor Lr and the capacitor Cr in FIG. 3 are respectively the second resistor, the second inductor and the capacitor in the present implementing solution.

The resistance value and the inductance value of the electrically conducting coil of the linear resonance actuator are respectively the resistance value of the first resistor and the inductance value of the first inductor, and the resistance value of the second resistor, the inductance value of the second inductor and the capacitance value are obtained by calculating of the resistance value and the inductance value of the electrically conducting coil of the linear resonance actuator, the operating current I and the operating voltage V of the linear resonance actuator, and the resonance frequency $\omega_0$ and the frequency bandwidth $B_0$ of the oscillator of the linear resonance actuator.

In a preferable technical solution of the present embodiment, the circuit in FIG. 3 further comprises: a first current sensor that is connected to one end of the second resistor or one end of the second inductor or one end of the capacitor, an output quantity of the first current sensor is a load current of the linear resonance actuator; and/or, a first voltage sensor that is connected in parallel to the second resistor; and/or, a second voltage sensor that is connected in parallel to the second inductor; and/or, a third voltage sensor that is connected in parallel to the capacitor; and/or, a fourth voltage sensor that is connected in parallel to the input end of the coupler, an output quantity of the fourth voltage sensor is a back electromotive force voltage of the linear resonance actuator.

As shown in FIG. 5, compared with FIG. 3, the circuit in FIG. 5 further comprises: a first converter that is connected to the first current sensor, an output quantity of the first converter is a resultant force of an oscillator of the linear resonance actuator; and/or, a second converter that is connected to the first voltage sensor, an output quantity of the second converter is a velocity of the oscillator of the linear resonance actuator; and/or, a third converter that is connected to the second voltage sensor, an output quantity of the third converter is an acceleration of the oscillator of the linear resonance actuator; and/or, a fourth converter that is connected to the third voltage sensor, an output quantity of the fourth converter is a displacement of the oscillator of the linear resonance actuator.

The conversion coefficient of the first converter $M_{LRA}$ is the electromagnetic parameter Km of the linear resonance actuator; the conversion coefficient of the second converter $M_R$ is obtained by calculating of the electromagnetic parameter Km of the linear resonance actuator and the resistance value of the second resistor; the conversion coefficient of the third converter $M_L$ is obtained by calculating of the electromagnetic parameter Km of the linear resonance actuator and the inductance value of the second inductor; and the conversion coefficient of the fourth converter $M_C$ is obtained by calculating of the electromagnetic parameter Km of the linear resonance actuator and the capacitance value of the capacitor.

In conclusion, the application discloses a method and circuit for acquiring an output quantity of a linear resonance actuator. According to the present technical solution, a circuit module or system model that simulates the linear resonance actuator is established by using passive electrical devices, and in the process of developing and debugging of projects, the present technical solution may be used to replace the technical solutions that directly use physical actuators, to improve the work efficiency and avoid the relying on physical actuators. Moreover, according to the present technical solution, an electrical signal that is outputted at the measuring point is collected based on the circuit module to obtain the output quantity of the simulated linear resonance actuator, or a transfer function from an input end of the circuit to the measuring point is calculated based on the circuit module, and the output quantity of the simulated linear resonance actuator is directly calculated from the transfer function, thus a technical solution of computer simulation is provided, and the output quantity of the actuator in the testing process is obtained by the algorithms without using actuators or other electron devices, thereby avoiding the disadvantages of the prior art that actuators are liable to damage or interference by the external environment and the efficiency is low.

According to the present technical solution, module of the linear resonance actuator is reasonably established according to its operating principle, and the working process of the actuator is simulated based on the efficient and simple module, thus the research period of the driving and controlling systems of the actuator can be effectively shortened, and the test effect of tactile vibration can also be simulated. In addition, the modeling and simulation may also be used in the design stage of linear resonance actuators, to simulate and predict its performance before the establishing of the physical model. In the design and development process of tactile feedback systems, the present technical solution is of great practical significance.

In order to clearly describe the technical solutions of the embodiments of the application, wordings like "first" and "second" are used to distinguish the same or similar items that have essentially the same functions and effects in the embodiments of the application. A person skilled in the art can understand that, the wordings like "first" and "second" are not used to define quantity and execution order.

The above description is only special embodiments of the application. By the teaching of the application, a person skilled in the art can make other modifications or variations on the basis of the above embodiments. A person skilled in the art should appreciate that, the above special description is only for the purpose of explaining the application better, and the protection scope of the application should be defined by the claims.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the invention as set forth in the appended claims and their legal equivalents.

What is claimed is:

1. A method for acquiring an output quantity of a linear resonance actuator, wherein the method comprises the steps of:
    establishing a circuit that simulates the linear resonance actuator by using passive electrical devices according to an electrical parameter and a kinematic parameter of the linear resonance actuator, the passive electrical devices comprise at least a resistor, a capacitor and an inductor;
    selecting a measuring point in the circuit according to an output quantity that the linear resonance actuator needs; and
    inputting a driving signal of an input source to an input end of the circuit, and collecting an electrical signal that is outputted at the measuring point to obtain the output quantity of the simulated linear resonance actuator;
    wherein the step of establishing a circuit that simulates the linear resonance actuator by using passive electrical devices according to an electrical parameter and a kinematic parameter of the linear resonance actuator comprises:
    selecting a first resistor and a first inductor according to an electrical parameter of an electrically conducting coil of the linear resonance actuator; and, selecting a capacitor, a second resistor and a second inductor according to an electrical parameter of the electrically conducting coil of the linear resonance actuator and a kinematic parameter of an oscillator; and
    connecting the first resistor and the first inductor in series and connecting the capacitor, the second inductor and the second resistor in parallel to establish a first circuit that simulates the linear resonance actuator, wherein one end of the first resistor is connected to an anode end of the input source, one end of the first inductor is connected to a cathode end of the input source, the capacitor, the second inductor and the second resistor are connected in parallel to form a parallel resonance circuit, and two ends of the parallel resonance circuit are connected in series respectively between the other end of the first resistor and the other end of the first inductor;
    or, connecting the first resistor and the first inductor in series and connecting the capacitor, the second inductor and the second resistor in series to establish a second circuit that simulates the linear resonance actuator, wherein one end of the first resistor is connected to an anode end of the input source, one end of the first inductor is connected to a cathode end of the input source, the other end of the first resistor is connected to a first input end of a coupler, the other end of the first inductor is connected to a second input end of the coupler, the capacitor, the second inductor and the second resistor are connected in series to form a series resonance circuit, and two ends of the series resonance circuit are connected in series respectively between a first output end and a second output end of the coupler.

2. The method according to claim 1, wherein the step of establishing a circuit that simulates the linear resonance actuator by using passive electrical devices according to an electrical parameter and a kinematic parameter of the linear resonance actuator further comprises:
    setting a resistance value and an inductance value of the electrically conducting coil of the linear resonance actuator respectively as a resistance value of the first resistor and an inductance value of the first inductor; and
    obtaining a resistance value of the second resistor, a capacitance value of the capacitor and an inductance value of the second inductor by calculating according to the resistance value and the inductance value of the electrically conducting coil of the linear resonance actuator, an operating current and an operating voltage of the linear resonance actuator, and a resonance frequency and a frequency bandwidth of the oscillator of the linear resonance actuator.

3. The method according to claim 1, wherein when the circuit that simulates the linear resonance actuator is the first circuit, the step of selecting a measuring point in the circuit according to an output quantity that the linear resonance actuator needs comprises:
    selecting one end of the first resistor or one end of the first inductor as a measuring point of a resultant force of the oscillator of the linear resonance actuator;
    and/or, selecting the end of the second resistor that is connected to the first inductor as a measuring point of a velocity of the oscillator of the linear resonance actuator;
    and/or, selecting the end of the second inductor that is connected to the first inductor as a measuring point of a displacement of the oscillator of the linear resonance actuator;
    and/or, selecting the end of the capacitor that is connected to the first inductor as a measuring point of an acceleration of the oscillator of the linear resonance actuator;

and/or, selecting the capacitor as a measuring point of a back electromotive force voltage of the linear resonance actuator; and when the circuit that simulates the linear resonance actuator is the second circuit, the step of selecting a measuring point in the circuit according to an output quantity that the linear resonance actuator needs comprises:

selecting one end of the second resistor or one end of the second inductor or one end of the capacitor as a measuring point of a resultant force of the oscillator of the linear resonance actuator;

and/or, selecting the second resistor as a measuring point of a velocity of the oscillator of the linear resonance actuator;

and/or, selecting the second inductor as a measuring point of an acceleration of the oscillator of the linear resonance actuator;

and/or, selecting the capacitor as a measuring point of a displacement of the oscillator of the linear resonance actuator;

and/or, selecting the input end of the coupler as a measuring point of a back electromotive force voltage of the linear resonance actuator.

4. The method according to claim 3, wherein the step of collecting an electrical signal that is outputted at the measuring point to obtain the output quantity of the simulated linear resonance actuator comprises:

connecting a current sensor or a voltage sensor at each measuring point of the circuit;

collecting an electrical signal that is outputted by the current sensor or the voltage sensor; and obtaining by calculating the corresponding output quantity of the linear resonance actuator according to the electrical signals that are outputted by each measuring point.

5. The method according to claim 4, wherein the step of obtaining by calculating the corresponding output quantity of the linear resonance actuator according to the electrical signals that are outputted by each measuring point comprises:

calculating an electromagnetic parameter Km according to a length and a magnetic flux density of the electrically conducting coil of the linear resonance actuator;

calculating each conversion coefficient that is corresponding to the electrical signal that is outputted by each measuring point according to the electromagnetic parameter Km and a parameter of the passive electrical device in the circuit; and obtaining the output quantity corresponding to the linear resonance actuator by calculating a product of the electrical signal that is outputted by each measuring point and the conversion coefficient corresponding to the electrical signal.

6. The method according to claim 5, wherein when the circuit that simulates the linear resonance actuator is the first circuit, the step of calculating each conversion coefficient that is corresponding to the electrical signal that is outputted by each measuring point according to the electromagnetic parameter Km and a parameter of the passive electrical device in the circuit comprises:

obtaining the conversion coefficient of the electrical signal that is outputted at the measuring point corresponding to the resultant force of the oscillator of the linear resonance actuator by calculating according to the electromagnetic parameter Km;

obtaining the conversion coefficient of the electrical signal that is outputted at the measuring point corresponding to the velocity of the oscillator of the linear resonance actuator by calculating according to the electromagnetic parameter Km and a second resistance value;

obtaining the conversion coefficient of the electrical signal that is outputted at the measuring point corresponding to the displacement of the oscillator of the linear resonance actuator by calculating according to the electromagnetic parameter Km and a second inductance value; and obtaining the conversion coefficient of the electrical signal that is outputted at the measuring point corresponding to the acceleration of the oscillator of the linear resonance actuator by calculating according to the electromagnetic parameter Km and the capacitance value.

7. The method according to claim 5, wherein when the circuit that simulates the linear resonance actuator is the second circuit, the step of calculating each conversion coefficient that is corresponding to the electrical signal that is outputted by each measuring point according to the electromagnetic parameter Km and a parameter of the passive electrical device in the circuit comprises:

obtaining the conversion coefficient of the electrical signal that is outputted at the measuring point corresponding to the resultant force of the oscillator of the linear resonance actuator by calculating according to the electromagnetic parameter Km;

obtaining the conversion coefficient of the electrical signal that is outputted at the measuring point corresponding to the velocity of the oscillator of the linear resonance actuator by calculating according to the electromagnetic parameter Km and a second resistance value;

obtaining the conversion coefficient of the electrical signal that is outputted at the measuring point corresponding to the acceleration of the oscillator of the linear resonance actuator by calculating according to the electromagnetic parameter Km and a second inductance value; and obtaining the conversion coefficient of the electrical signal that is outputted at the measuring point corresponding to the displacement of the oscillator of the linear resonance actuator by calculating according to the electromagnetic parameter Km and the capacitance value.

8. A method for acquiring an output quantity of a linear resonance actuator, wherein the method comprises the steps of:

establishing a circuit that simulates the linear resonance actuator by using passive electrical devices according to an electrical parameter and a kinematic parameter of the linear resonance actuator, the passive electrical devices comprise at least a resistor, a capacitor and an inductor;

selecting a measuring point in the circuit according to an output quantity that the linear resonance actuator needs;

calculating a transfer function from an input end of the circuit to the measuring point; and obtaining the output quantity of the simulated linear resonance actuator by calculating according to a driving signal of an input source and the transfer function;

wherein the step of establishing a circuit that simulates the linear resonance actuator by using passive electrical devices according to an electrical parameter and a kinematic parameter of the linear resonance actuator comprises:

selecting a first resistor and a first inductor according to an electrical parameter of an electrically conducting coil of the linear resonance actuator; and, selecting a capacitor, a second resistor and a second inductor according to an electrical parameter of the electrically conducting coil of the linear resonance actuator and a kinematic parameter of an oscillator; and connecting the first resistor and the first inductor in series and connecting the capacitor, the second inductor and the second resistor in parallel to establish a first circuit that simulates the linear resonance actuator, wherein one end of the first resistor is connected to an anode end of the input source, one end of the first inductor is connected to a cathode end of the input source, the capacitor, the second inductor and the second resistor are connected in parallel to form a parallel resonance circuit, and two ends of the parallel resonance circuit are connected in series respectively between the other end of the first resistor and the other end of the first inductor;

or, connecting the first resistor and the first inductor in series and connecting the capacitor, the second inductor and the second resistor in series to establish a second circuit that simulates the linear resonance actuator, wherein one end of the first resistor is connected to an anode end of the input source, one end of the first inductor is connected to a cathode end of the input source, the other end of the first resistor is connected to a first input end of a coupler, the other end of the first inductor is connected to a second input end of the coupler, the capacitor, the second inductor and the second resistor are connected in series to form a series resonance circuit, and two ends of the series resonance circuit are connected in series respectively between a first output end and a second output end of the coupler.

9. The method according to claim 8, wherein the step of establishing a circuit that simulates the linear resonance actuator by using passive electrical devices, according to an electrical parameter and a kinematic parameter of the linear resonance actuator further comprises:

setting a resistance value and an inductance value of the electrically conducting coil of the linear resonance actuator respectively as a resistance value of the first resistor and an inductance value of the first inductor; and obtaining a resistance value of the second resistor, a capacitance value of the capacitor and an inductance value of the second inductor by calculating according to the resistance value and the inductance value of the electrically conducting coil of the linear resonance actuator, an operating current and an operating voltage of the linear resonance actuator, and a resonance frequency and a frequency bandwidth of the oscillator of the linear resonance actuator.

10. The method according to claim 8, wherein when the circuit that simulates the linear resonance actuator is the first circuit, the step of selecting a measuring point in the circuit according to an output quantity that the linear resonance actuator needs comprises:

selecting one end of the first resistor or one end of the first inductor as a measuring point of a resultant force of the oscillator of the linear resonance actuator;

and/or, selecting the end of the second resistor that is connected to the first inductor as a measuring point of a velocity of the oscillator of the linear resonance actuator;

and/or, selecting the end of the second inductor that is connected to the first inductor as a measuring point of a displacement of the oscillator of the linear resonance actuator;

and/or, selecting the end of the capacitor that is connected to the first inductor as a measuring point of an acceleration of the oscillator of the linear resonance actuator;

and/or, selecting the capacitor as a measuring point of a back electromotive force voltage of the linear resonance actuator; and when the circuit that simulates the linear resonance actuator is the second circuit, the step of selecting a measuring point in the circuit according to an output quantity that the linear resonance actuator needs comprises:

selecting one end of the second resistor or one end of the second inductor or one end of the capacitor as a measuring point of a resultant force of the oscillator of the linear resonance actuator;

and/or, selecting the second resistor as a measuring point of a velocity of the oscillator of the linear resonance actuator;

and/or, selecting the second inductor as a measuring point of an acceleration of the oscillator of the linear resonance actuator;

and/or, selecting the capacitor as a measuring point of a displacement of the oscillator of the linear resonance actuator;

and/or, selecting the input end of the coupler as a measuring point of a back electromotive force voltage of the linear resonance actuator.

11. The method according to claim 8, wherein the step of calculating a transfer function from an input end of the circuit to the measuring point comprises:

determining conversion relation between the output quantity of the linear resonance actuator and an electrical signal that is outputted at the measuring point of the circuit; and calculating the transfer function of the circuit that uses the output quantity of the linear resonance actuator as an output variable and uses the driving signal of the input end as an input variable according to the correspondence relation, a circuit structure of the circuit and a parameter of the passive electrical device.

12. The method according to claim 11, wherein the step of establishing a circuit that simulates the linear resonance actuator by using passive electrical devices comprises:

establishing the circuit that simulates the linear resonance actuator by using two inductors, one capacitor and two resistors, and the step of calculating a transfer function from an input end of the circuit to the measuring point particularly comprises:

obtaining a three-order transfer function from the input end of the circuit to the measuring point by calculating according to inductance values of the two inductors, resistance values of the two resistors and a capacitance value.

13. The method according to claim 11, wherein the step of establishing a circuit that simulates the linear resonance actuator by using passive electrical devices comprises:

establishing the circuit that simulates the linear resonance actuator by using one inductor, one capacitor and two resistors; and the step of calculating a transfer function from an input end of the circuit to the measuring point particularly comprises:

obtaining a two-order transfer function from the input end of the circuit to the measuring point by calculating according to an inductance value, a capacitance value and resistance values of the two resistors.

14. A circuit for acquiring an output quantity of a linear resonance actuator, wherein the circuit comprises: a first resistor, a first inductor, a capacitor, a second inductor and a second resistor; and the capacitor, the second inductor and the second resistor are connected in parallel to form a parallel resonance circuit, one end of the first resistor is an anode input end, one end of the first inductor is a cathode input end, and the other end of the first resistor and the other end of the first inductor are connected to two ends of the parallel resonance circuit respectively;

or, the capacitor, the second inductor and the second resistor are connected in series to form a series resonance circuit, one end of the first resistor is an anode input end, one end of the first inductor is a cathode input end, the other end of the first resistor is connected to a first input end of a coupler, the other end of the first inductor is connected to a second input end of the coupler, and the first output end and the second output end of the coupler are connected to two ends of the series resonance circuit respectively;

wherein the resistance values of the first resistor and the second resistor, the inductance values of the first inductor and the second inductor and the capacitance value of the capacitor are determined by an electrical parameter and a kinematic parameter of the linear resonance actuator.

15. The circuit according to claim 14, wherein when the capacitor, the second inductor and the second resistor are connected in parallel to form a parallel resonance circuit, the circuit further comprises:

a first current sensor that is connected to one end of the first resistor or one end of the first inductor, an output quantity of the first current sensor is a load current of the linear resonance actuator;

and/or, a second current sensor that is connected to the end of the second resistor that is connected to the first inductor;

and/or, a third current sensor that is connected to the end of the second inductor that is connected to the first inductor;

and/or, a fourth current sensor that is connected to the end of the capacitor that is connected to the first inductor;

and/or, a voltage sensor that is connected in parallel to the capacitor, an output quantity of the voltage sensor is a back electromotive force voltage of the linear resonance actuator.

16. The circuit according to claim 15, wherein the circuit further comprises:

a first converter that is connected to the first current sensor, an output quantity of the first converter is a resultant force of an oscillator of the linear resonance actuator;

and/or, a second converter that is connected to the second current sensor, an output quantity of the second converter is a velocity of the oscillator of the linear resonance actuator;

and/or, a third converter that is connected to the third current sensor, an output quantity of the third converter is a displacement of the oscillator of the linear resonance actuator;

and/or, a fourth converter that is connected to the fourth current sensor, an output quantity of the fourth converter is an acceleration of the oscillator of the linear resonance actuator; and a conversion coefficient of the first converter $G_{LRA}$ is an electromagnetic parameter Km of the linear resonance actuator, a conversion coefficient of the second converter $G_R$ is obtained by calculating according to the electromagnetic parameter Km of the linear resonance actuator and the resistance value of the second resistor; a conversion coefficient of the third converter $G_L$ is obtained by calculating according to the electromagnetic parameter Km of the linear resonance actuator and the inductance value of the second inductor; a conversion coefficient of the fourth converter $G_C$ is obtained by calculating according to the electromagnetic parameter Km of the linear resonance actuator and the capacitance value of the capacitor.

17. The circuit according to claim 14, wherein when the capacitor, the second inductor and the second resistor are connected in series to form a series resonance circuit, the circuit further comprises:

a first current sensor that is connected to one end of the second resistor or one end of the second inductor or one end of the capacitor, an output quantity of the first current sensor is a load current of the linear resonance actuator;

and/or, a first voltage sensor that is connected in parallel to the second resistor;

and/or, a second voltage sensor that is connected in parallel to the second inductor;

and/or, a third voltage sensor that is connected in parallel to the capacitor;

and/or, a fourth voltage sensor that is connected in parallel to the input end of the coupler, an output quantity of the fourth voltage sensor is a back electromotive force voltage of the linear resonance actuator.

18. The circuit according to claim 17, wherein the circuit further comprises:

a first converter that is connected to the first current sensor, an output quantity of the first converter is a resultant force of an oscillator of the linear resonance actuator;

and/or, a second converter that is connected to the first voltage sensor, an output quantity of the second converter is a velocity of the oscillator of the linear resonance actuator;

and/or, a third converter that is connected to the second voltage sensor, an output quantity of the third converter is an acceleration of the oscillator of the linear resonance actuator;

and/or, a fourth converter that is connected to the third voltage sensor, an output quantity of the fourth converter is a displacement of the oscillator of the linear resonance actuator; and a conversion coefficient of the first converter $M_{LRA}$ is an electromagnetic parameter Km of the linear resonance actuator; a conversion coefficient of the second converter $M_R$ is obtained by calculating according to the electromagnetic parameter Km of the linear resonance actuator and the resistance value of the second resistor; a conversion coefficient of the third converter $M_L$ is obtained by calculating according to the electromagnetic parameter Km of the linear resonance actuator and the inductance value of the second inductor; a conversion coefficient of the fourth converter $M_C$ is obtained by calculating according to the electromagnetic parameter Km of the linear resonance actuator and the capacitance value of the capacitor.

* * * * *

UNITED STATES PATENT AND TRADEMARK OFFICE
CERTIFICATE OF CORRECTION

PATENT NO. : 10,432,125 B2
APPLICATION NO. : 15/762100
DATED : October 1, 2019
INVENTOR(S) : Yongqiang Feng et al.

It is certified that error appears in the above-identified patent and that said Letters Patent is hereby corrected as shown below:

On the Title Page

Item (57), Abstract Column 2, Line 13, and page 2, Column 1, Lines 1-6, should be deleted: "According to the technical solution of the application, a circuit module or system model that simulates the linear resonance actuator is established and used in the process of developing and debugging of projects, to replace the technical solutions that directly use physical actuators, thereby improving the efficiency and avoiding the relying on physical actuators"

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*